United States Patent [19]

Mebane et al.

[11] Patent Number: 4,806,106
[45] Date of Patent: Feb. 21, 1989

[54] INTERCONNECT LEAD FRAME FOR THERMAL INK JET PRINTHEAD AND METHODS OF MANUFACTURE

[75] Inventors: Janet E. Mebane; Lawrence W. Chan; Duong T. La; Ruben Nevarez, all of San Diego, Calif.

[73] Assignee: Hewlett-Packard Company, Palo Alto, Calif.

[21] Appl. No.: 37,289

[22] Filed: Apr. 9, 1987

[51] Int. Cl.[4] .................... H05K 1/00; H01R 43/00
[52] U.S. Cl. ........................................ 439/77; 29/611;
29/620; 29/827; 174/52.4; 346/75; 439/70;
439/71
[58] Field of Search ................. 29/611, 827, 620, 884,
29/834; 346/75; 219/216; 174/52 FP; 361/394;
357/72; 439/60, 69, 70, 71, 72, 77

[56] References Cited

U.S. PATENT DOCUMENTS

| | | |
|---|---|---|
| 3,755,892 | 9/1973 | Dieterich ........................ 29/884 X |
| 3,803,709 | 4/1974 | Beltz et al. ..................... 29/827 |
| 3,808,506 | 4/1974 | Lang ............................. 361/394 |
| 3,890,702 | 6/1975 | Lane, III ........................ 29/611 |
| 3,952,410 | 4/1976 | Garretson et al. ................ 29/834 |
| 4,155,615 | 5/1979 | Zimmerman, Jr. et al. ...... 29/827 X |
| 4,680,859 | 7/1987 | Johnson ......................... 29/611 |
| 4,701,781 | 10/1987 | Sankhagowit .................. 357/72 X |

Primary Examiner—Carl J. Arbes
Attorney, Agent, or Firm—William J. Bethurum

[57] ABSTRACT

Disclosed herein is a method and apparatus for interconnecting a flexible (flex) circuit, printed circuit or the like to an ink jet printhead or other similar electronic device. This approach includes providing a flexible lead frame member between the flex circuit and printhead, with the lead frame member having a plurality of conductive leads or fingers extending at a predetermined angle with respect to the final plane of interconnection. During the interconnection process, these leads or fingers are spring biased through this predetermined angle to provide good compressive electrical contact between the two members interconnected by the lead frame in a single plane of interconnection.

13 Claims, 11 Drawing Sheets

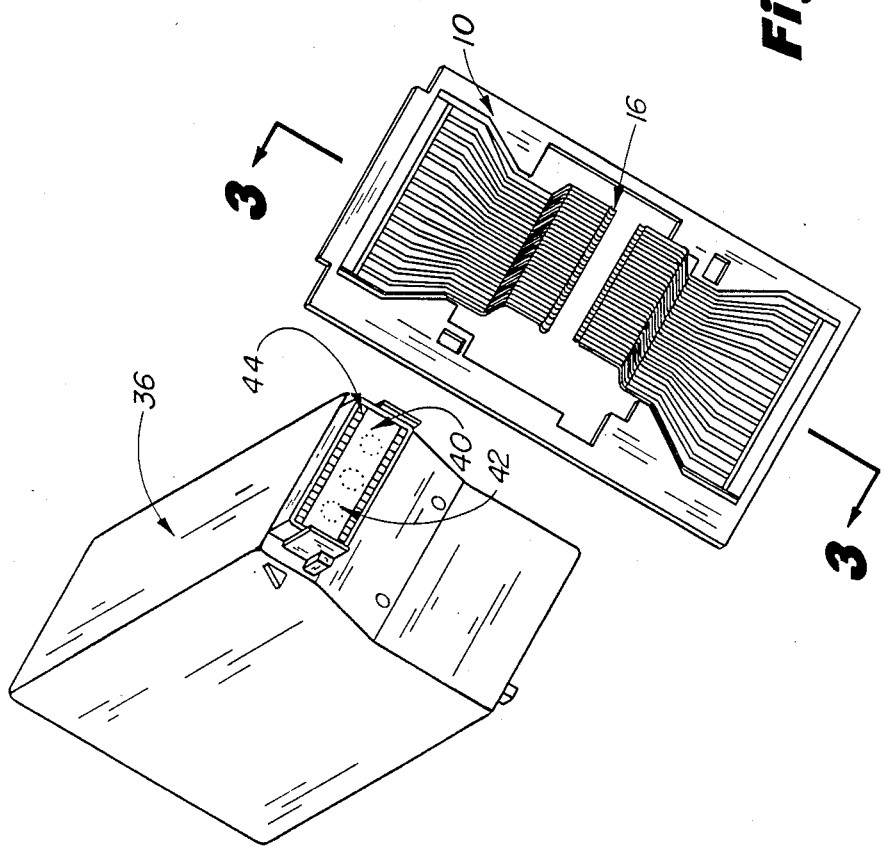

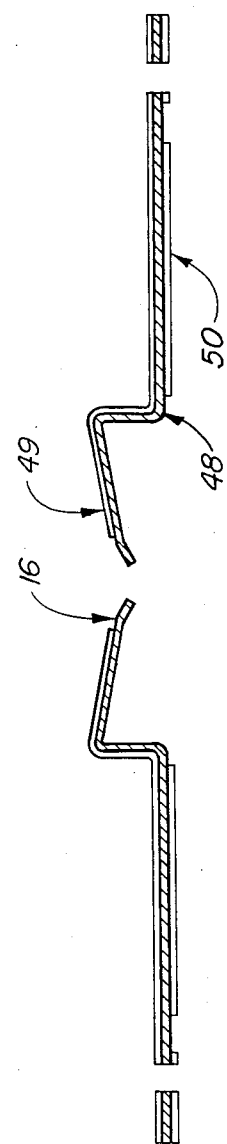

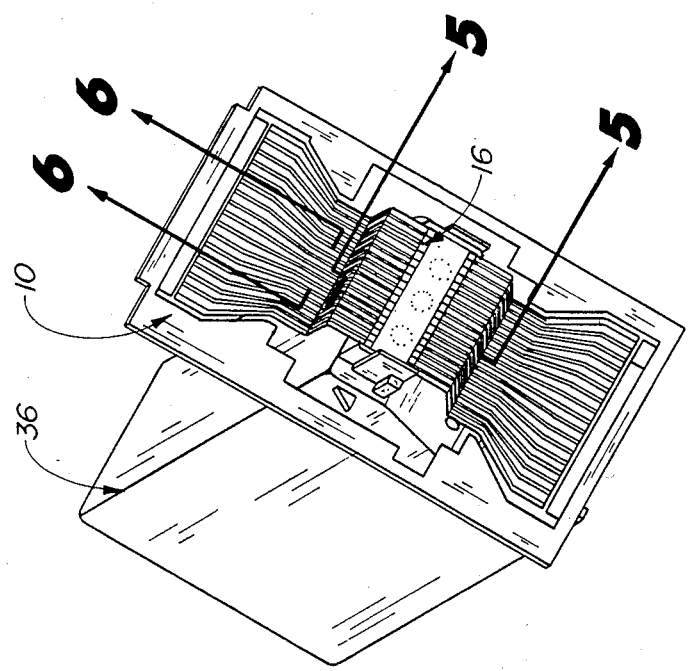

INTERCONNECT LEAD FRAME FOR THERMAL INK JET PRINTHEAD AND METHODS OF MANUFACTURE

TECHNICAL FIELD

This invention relates generally to thermal ink jet printing and more particularly to a new and improved electrical interconnect lead frame for supplying power to an ink jet printhead or similar electronic device.

BACKGROUND ART

In the art of thermal ink jet printing, it is known to use flexible (flex) circuits to provide driving current to a plurality of heater resistors which are photolithographically defined on a thin film resistor (TFR) type thermal ink jet printhead. This flex circuit connection is sometimes accomplished by providing dimples at preselected areas in the flex circuit and using these dimples to mate with corresponding electrical contact areas on the thermal ink jet printhead. Pressure pads are applied on the reverse side of the flex circuit and in the concave reverse surfaces of the dimples to provide the necessary compressive forces to make good electrical contact between the thermal ink jet printhead and the flex circuit. Thus, good firm and continuous electrical connections are maintained between the flex circuit and the thermal ink jet printhead as the printhead moves rapidly back and forth along a platen during a thermal ink jet printing operation.

During this latter motion, a loop in the flex circuit rolls back and forth along the length of the platen at a relatively high speed and with frequent jerking and direction reversal motions. Accordingly, it is imperative that this good firm electrical connection between the flex circuit and the printhead be continuously maintained once the thermal ink jet printhead and associated ink reservoir housing are locked into position in the printhead carriage. This type of printhead and flex circuit connection is disclosed, for example, in the *Hewlett-Packard Journal*, Volume 36, Number 5, May 1985, incorporated herein by reference.

Whereas the above approach to making flex circuit contacts to thermal ink jet printheads has proven generally satisfactory in many respects, the above requirement for applying pressure pads to the dimples in the flex circuit necessitates providing a corresponding space for these dimples and pads. A part of this space requirement is defined by a vertical space dimension in the Z direction with respect to the XY plane of the printhead, and such vertical dimension represents a significant percentage of the total vertical space available within the printhead carriage. Futhermore, the lateral dimension of the dimples and the corresponding space requirement therefor in the horizontal or XY plane of the printhead imposes a corresponding limitation on how much the printhead surface area can be reduced.

DISCLOSURE OF INVENTION

The general purpose of this invention is to provide a new and improved approach to interconnecting thermal ink jet printheads to flex circuits or printed circuits. Using this approach, the above space requirements in all of the X, Y and Z directions relative to the pressure pad dimple interconnect technique of the prior art have been substantially reduced. In addition, the requirement for dimpled flex circuits and corresponding pressure pads has been totally eliminated.

To accomplish this purpose, we have discovered and developed a novel interconnect circuit and method of manufacture wherein we provide a lead frame with flexible leads extending at a predetermined angle $\theta$ with respect to a chosen plane of interconnection. One end of the lead frame is electrically connected to an external set of contacts, and an electrical device is brought into contact with ends of the flexible leads to thereby move the leads through the predetermined angle $\theta$ and to the plane of interconnection. In this manner, good compressive forces in electrical connection are established at the plane of interconnection between the electrical device and the lead frame.

The lead frame itself includes a plurality of electrical contact areas at one location thereon, and these contact areas are electrically connected to the corresponding plurality of flexible leads at another location within the lead frame. Thus, these leads may be flexed and spring biased through the angle $\theta$ to the plane of interconnection when receiving an electrical device in good compressive electrical contact, and the external contacts, the lead frame contacts, and the contacts on the electrical device all lie substantially in a single plane of interconnection.

In the manufacture of this electrical interconnect lead frame member, a metal pattern is provided within a lead frame type structure and includes plurality of metal fingers or leads extending in parallel towards a central area within the lead frame. This interconnect circuit includes connection tips on the ends of these leads which define areas of connection to a corresponding plurality of mating contact pads on a thermal ink jet printhead. These fingers or leads further extend to a remote area of the lead frame and terminate at a plurality of electrical contact areas to which flex circuits or printed circuits may be connected.

The fingers or leads are insulated one from another with a suitable insulating material, and the leads extend toward the central area of the lead frame at a predetermined angle with respect to the plane of electrical interconnection with the printhead. Thus, the movement of the printhead into contact with the tips of these leads will flex the leads to a spring biased position and create compressive forces between the tips of the leads and the mating contact pads on the thermal ink jet printhead. These compressive forces eliminate the need for dimples in a flex circuit and the corresponding pressure pads therefor, and thus the distance between the printhead surface on one side of the interconnect circuit and the paper on the other side of the interconnect circuit is minimized.

Additionally and most advantageous is the fact that the wiping action of the sharp edges of the tips of the leads causes scratching at the contact pads on which they come to rest. This wiping action thus further improves the electrical contact between these abutting contact members by breaking through any contamination or oxidation layers which may form on the surfaces of these contact pads.

The above advantages and novel features of this invention will become better understood from the following description of the accompanying drawings.

BRIEF DESCRIPTION OF THE DRAWINGS

FIG. 1 is an isometric view of the hybrid interconnect lead frame according to the invention.

FIG. 2 is an isometric view of the lead frame of FIG. 1A and showing its mating spatial relationship to a thermal ink jet printhead prior to electrical interconnection of these two members.

FIG. 3 is a cross section view taken along lines 3—3 of FIG. 2.

FIG. 4 is an isometric view similar to FIG. 2 and taken after insertion of the printhead into the printhead carriage where it makes electrical interconnection to the lead frame member.

BEST MODE FOR CARRYING OUT THE INVENTION

Figures 1A, 1B:
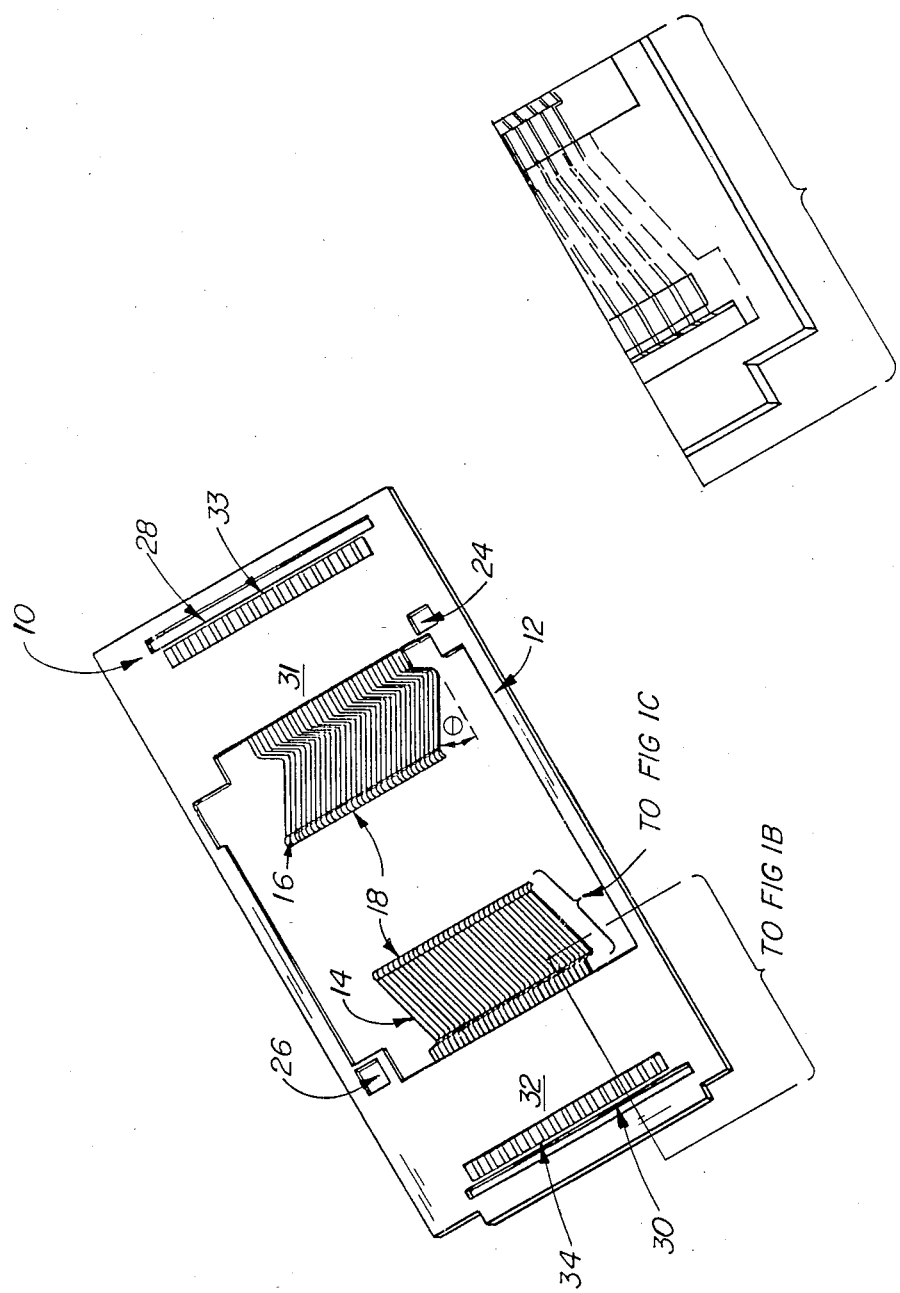
FIG. 1B is a greatly enlarged fragmented view of an end portion of the lead frame of FIG. 1A and illustrating the path of the conductive leads extending through outer insulating material.

Referring now to FIG. 1A, the hybrid interconnect lead frame 10 includes an outer frame member 12 of rectangular geometry and surrounding a plurality of laminated flexible lead members 14 which extend as shown at an angle $\theta$ into a central region of the frame. Here the tips 16 of the individual flexible leads are exposed for spring biased electrical connection to an ink jet printhead as will be further described.

The tips 16 of the leads extending from opposite ends of the frame 10 are separated by a dimension indicated as 18 which corresponds to the width dimension of a thermal ink jet printhead. Electrical contact pads of this printhead will make contact with the tips 16 of the leads as these leads are moved through the angle $\theta$ of approximately 15° and to the plane of interconnection with the printhead.

The lead frame of FIG. 1A further includes index or alignment openings 24 and 26 on each side thereof and elongated slots 28 and 30 on each end. Until the final stage of the manufacturing process, the leads 14 are connected to the frame member 12 in order to facilitate gold plating of the lead frame. The slots 28 and 30 are then cut out to separate the leads 14 from the outer metal frame member 12 to thereby electrically isolate these members 12 and 14.

The lead frame 10 is constructed of a beryllium copper (Be.Cu) alloy interior substrate which is selectively coated with a polyimide on both surfaces thereof after the etching process described below to expose the tip portions of the metal fingers 14. Preferably, this polyimide material is available under the tradename "Kapton" and is sold by the DuPont Company of Wilmington, Delaware. In a typical lead frame member 10 of the type described, the Be.Cu substrate will be about 8 mils in thickness and the layer of Kapton on each side thereof, including an adhesive, will be in the range of 2-5 mils in thickness. The individual leads 14 are insulated one from another by the polyimide and extend between the two layers of polyimide through regions 31, 32 and terminate at exposed contact pads 33, 34 which are located adjacent the rectangular slots 28 and 30. This is illustrated in FIG. 1B, in which the dashed lines indicate the presence of the BeCu leads and frame under the covering layer of polyimide. The leads 14 extend to the contact pads 33, 34 but are connected to the frame with polyimide only.

Figure 1D:
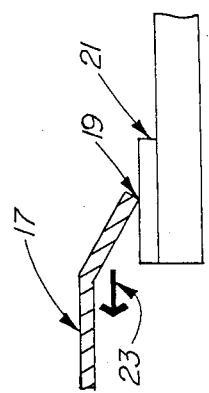
FIG. 1D is a cross section view of an alternative contact tip construction for the lead frame according to the invention.
Figure 1C:
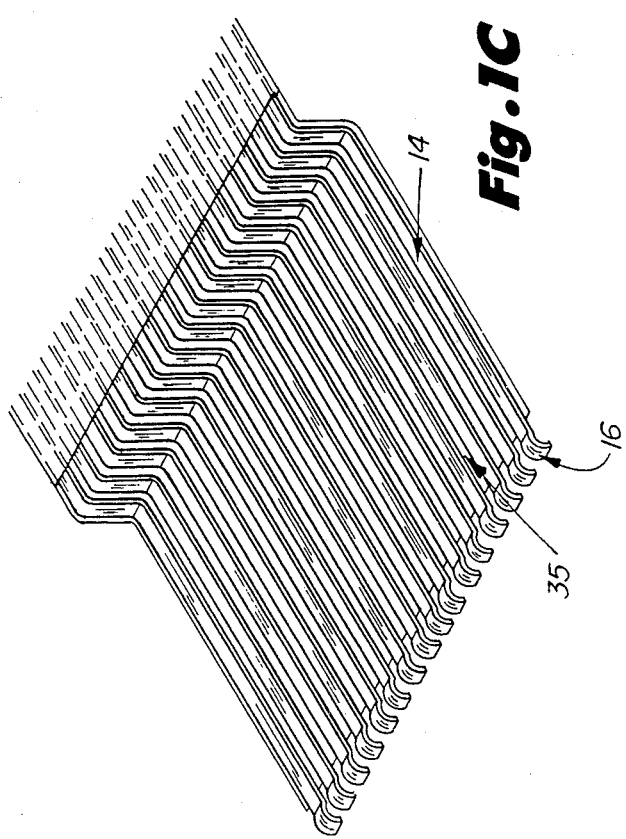
FIG. 1C is an enlarged view of the end portions of the leads and contact areas in FIG. 1A.

In FIG. 1C, the Be.Cu leads 14 are shown in more detail and are laminated with Kapton 35 on their upper and lower surfaces and in the regions between adjacent leads in the geometry shown. These leads 14 are formed individually from a Be.Cu substrate by the etching process described below, and the center-to-center spacing of these leads will typically be on the order of 1.0 to 1.1 millimeters. The lead frame portion in FIG. 1B is shown in its spring biased L-shaped position, with the ends 16 of the leads spring biased to the plane of interconnection where contact is made to an ink jet pen body. This pen body may, for example, be of the type shown in FIG. 2.

It is important that the polyimide Kapton be sufficiently rigid so that it holds the lead fingers together and maintains a constant separation therebetween, while simultaneously allowing these fingers to flex independently of one another and to accomodate for differences in contact pad height, for example, produced by variations in manufacturing tolerances.

Referring to FIG. 1D, the lead tip 17 of the flexible lead frame may be constructed to have a sharp edge 19 which serves to make an abrasive contact with the surface of a contact pad 21. Thus, the wiping motion indicated by the arrow 23 is capable of breaking through any contamination or oxidation layer which forms on the surface of pad 21. This wiping motion is produced by the deflection of the lead frame during pen latching and causes the edge 19 of the lead tip 17 to travel approximately 0.2 millimeters in the direction of the arrow 23. In addition, the width of the lead edge 19 is kept at a minimum, e.g. about 0.25 millimeters, in order to avoid any trapping of fibers underneath it.

Referring now to FIG. 2, the pen body 36 shown therein will typically be of the type described and claimed in copending application Ser. No. 880,774 of Jeffrey Baker et al, filed July 1, 1986 and assigned to the present assignee. This copending application is incorporated herein by reference and describes the pen body 36 having a rectangularly shaped end housing structure 38 for receiving a thin film resistor (TFR) substrate (not shown) which is covered by an ink ejection orifice plate 40. The orifice plate 40 will typically have three (3) circularly shaped orifice clusters 42 for ejecting ink colors of cyan, magenta and yellow during an ink jet color printing operation, and may also include an additional orifice (not shown) for ejecting black ink.

The thin film resistor (TFR) substrate which is shielded from view by the orifice plate 40 includes a plurality of individual contact pads 44 positioned around the periphery of the substrate. These contact pads 44 are positioned to receive the corresponding plurality of lead frame tips 16 of th Be.Cu lead frame described above. In one type of thin film resistor (TFR) substrate and process particularly suitable for practicing this invention, the substrate contacts are fabricated using a novel peripheral contact and lead-in structure. This structure and process are disclosed and claimed in copending application Ser. No. 902,287 of John L. Stoffel filed Aug. 28, 1986 and entitled "Process for Manufacturing Thermal Ink Jet Printheads and Integrated Circuit (IC) Structures Produced Thereby", assigned to the present assignee and also incorporated herein by reference.

Referring now to FIG. 3, there is shown a cross section view of the hybrid interconnect lead frame taken along lines 3—3 of FIG. 2. The exposed lead tips 16 extend toward the central area of the lead frame in the unbiased position and at an angle $\theta$ with respect to the plane of interconnection as previously described. The Be.Cu alloy leads 48 are laminated on both sides, with the polyimide laminate Kapton 49 extending on the top surface of the leads to near the ends 16 thereof. This polyimide laminate material 50 on the lower surface of the Be.Cu lead 48 extends only to an area adjacent the L shaped bend thereof. This configuration is chosen because it is desirable to minimize the amount of polyimide in the bend area of the lead frame in order to improve bending tolerances. Also, a single layer of polyimide in the region of the lead frame that flexes is typically an optimum amount for holding the leads together while still allowing them to flex somewhat independently.

Referring now to FIG. 4, the pen body 36 is shown in its in-carriage position where the Be.Cu leads are spring biased to the plane of interconnection. In this position, the hybrid interconnect lead frame makes good compressive electrical connection with the tips 16 of the Be.Cu leads, and these metal alloy tips 16 will wipe the surfaces of the contact pads 44 of the printhead shown in FIG. 2.

Figure 5A:
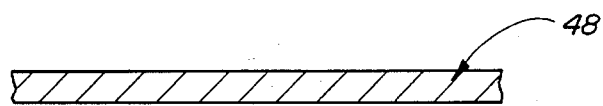
FIGS. 5A through 5F illustrate the process sequence used to make the lead frame interconnect circuit construction thereof along the interior portions of the lead frame in the cross section of lines 5—5 of FIG. 4.
Figure 5B:
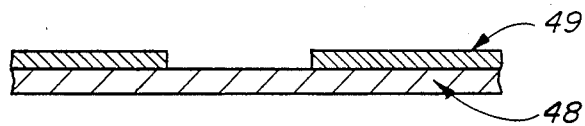
Figure 5C:
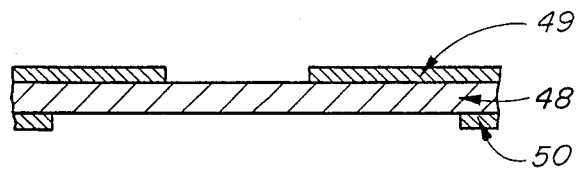
Figure 5D:
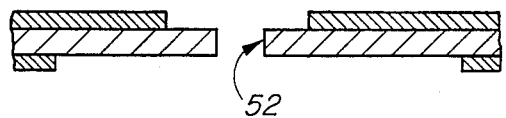

Referring now to FIGS. 5A through 5F, these schematic cross section views correspond to the fabrication process for creating the final cross section taken along lines 5—5 of FIG. 4. FIG. 5A shows a cross section of the Be.Cu substrate 48 taken along the length dimension thereof. The substrate 48 is typically 6-8 mils in thickness and is provided with a Kapton protective and insulating polyimide layer 49 in the geometry shown in FIG. 5B on the topside of the substrate 48. Another protective Kapton coating 50 is provided in the geometry shown in FIG. 5C on the lower surface of the substrate 48. The Be.Cu substrate is then cut or etched in the center thereof as shown in FIG. 5D to form the opening 52 therein. The Kapton layers 49 and 50 are typically comprised of 1 mil of polyimide, with an additional 5-6 mils total of adhesive divided between the two layers of Kapton.

Figure 5E:
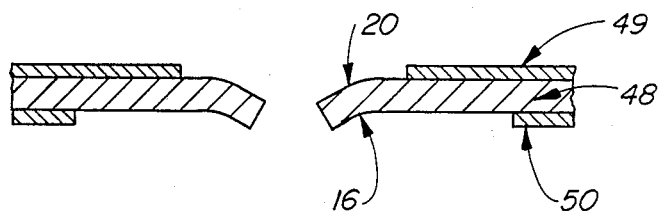
Figure 5F:
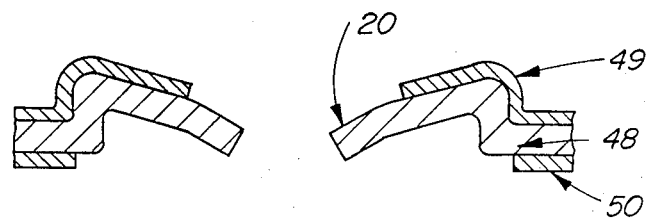

In the next two processing steps shown in FIGS. 5E and 5F, the tips 16 are bent slightly at the ends (FIG. 5E) and then are bent again as shown in FIG. 5F to give the final cross section geometry of the Be.Cu leads in a cross section taken along lines 5—5 of FIG. 4. The bending of the tip 16 in FIG. 5E enhances the scratching action of the tip and improves the electrical contact thereof. The bend made in FIG. 5F sets the bend angle $\theta$ as previously described. At this point the exposed BeCu is gold plated to prevent corrosion of the contact tips and thereby enhance contact reliability, and the slots indicated as 28 and 30 of FIG. 1A are cut out.

Figure 6A:
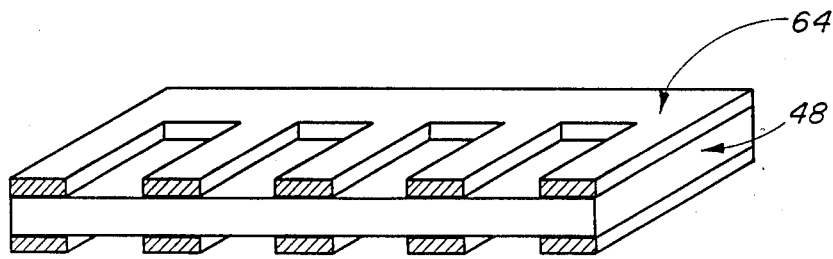
FIGS. 6A-6D illustrate a process sequence corresponding to FIGS. 5A-5D and taken along portions of the lead frame in the plane of lines 6—6 of FIG. 4.
Figure 6B:
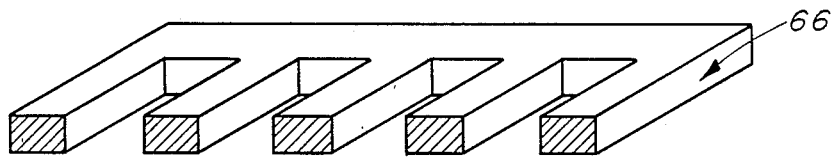
Figure 6C:
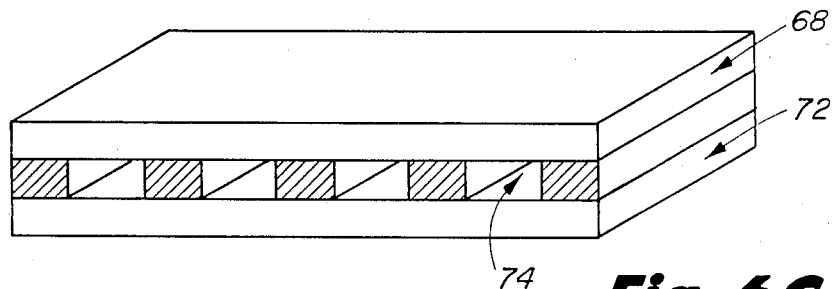
Figure 6D:
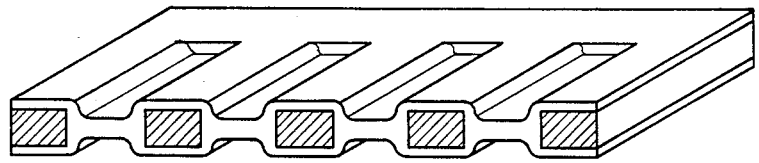

Referring now to FIGS. 6A–6D, there is shown a process sequence in the lead frame fabrication to create the final cross section taken along lines 6—6 of FIG. 4. This process sequence provides a more complete understanding of exactly how the lead frame of FIG. 1A is formed and laminated with the polyimide Kapton. In FIG. 6A, the Be.Cu substrate 48 is initially masked with a photoresist etch mask 64 in the geometry shown and then exposed to a ferric chloride etch. Here the metal in the exposed regions of FIG. 6A is etched away to leave the metal lead frame 66 in the geometry shown in FIG. 6B. Then, the lead frame 66 of FIG. 6B is covered on both sides with layers 68 and 72 of Kapton, each having a thin adhesive layer (not shown) thereon. Next, the structure of FIG. 6C is transferred to a heat staker or press (not shown) wherein both Kapton layers 68 and 72 are exposed to heat and pressure for a predetermined time to cause the adhesive to flow into the openings 74 between adjacent metal leads. This process step leaves the resultant laminated lead frame structure as shown in FIG. 6D.

In the above lamination process, the Be.Cu leads should not reach 300° F. in less than 5 minutes in order to avoid premature edge sealing and entrapped air in the laminated structure. The pressure applied to the Kapton should be about 200 psi and the lead frame should then be cured for about one hour at 350° F.

In a preferred embodiment of the invention, the center-to-center spacing of adjacent leads is on the order of 1.0 to 1.1 millimeters and the laminating polyimide Kapton is about 7 mils in total thickness for both sides. The Kapton includes about one mil polyimide on each side and five (5) mils total adhesive for both sides. This hybrid interconnect lead frame was fabricated according to Hewlett Packard's specification by the Century Circuits and Electronics Company of St. Paul, Minn., and this Kapton-metal fabrication technology is described in some detail in their Data Bulletin No. 1280 entitled "High Technology Flexible Printed Circuits", published in 1986 and incorporated herein by reference.

Figure 7:
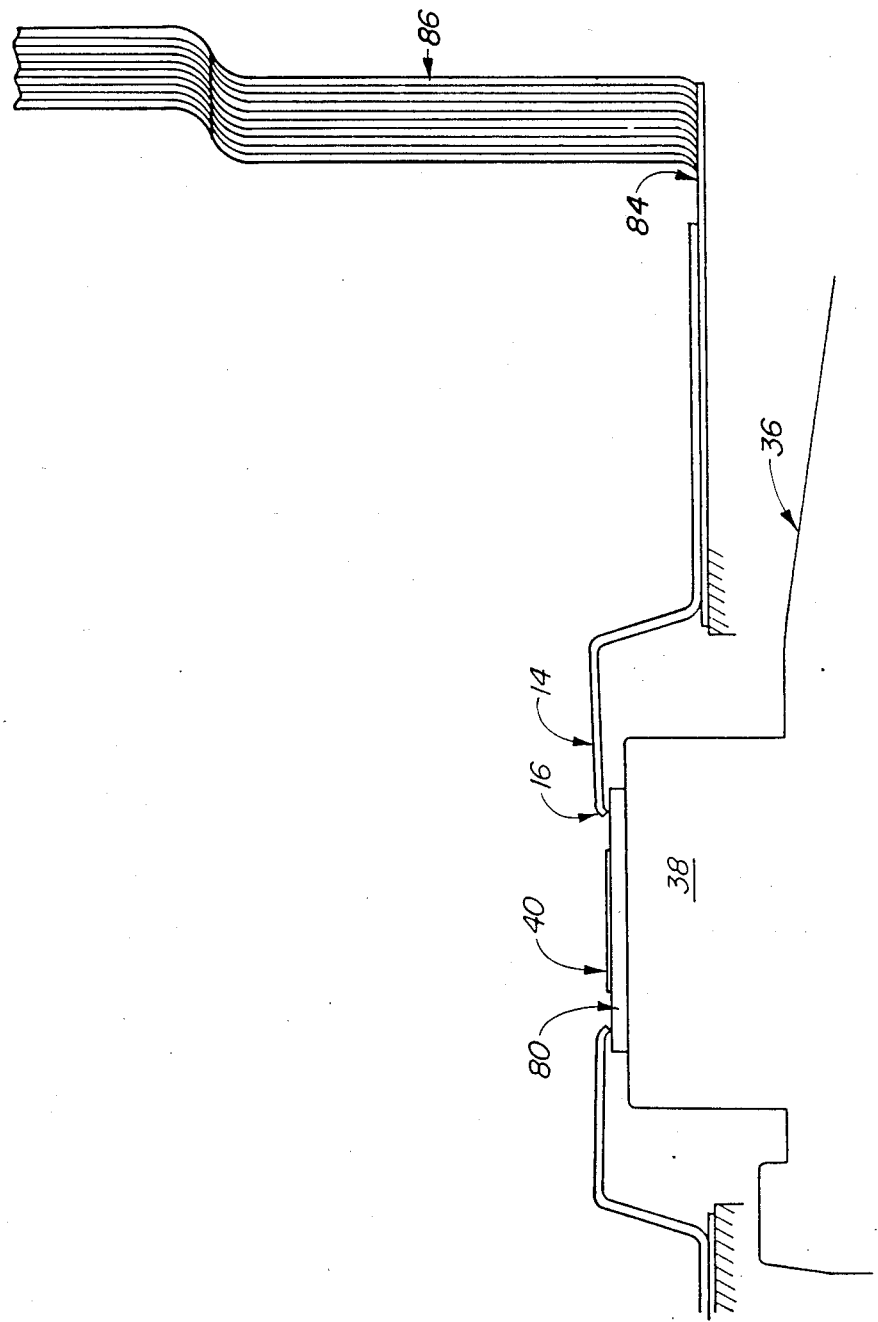
FIG. 7 is a schematic view of the lead frame in contact with the ink jet printhead in its in-carriage print position and making electrical interconnection between the printhead and a flexible (flex) circuit.

Referring now to FIG. 7, there is shown the TFR substrate support member 38 of the pen body 36 which receives the thin film resistor substrate 80 on the upper surface thereof. The substrate 80 includes a plurality of adjacent metal contact pads (not shown in FIG. 7) spaced around the periphery thereof for making electrical contact to the ends 16 of the Be.Cu leads 14. The orifice plate 40 is positioned as shown in the center of the thin film resistor substrate 80. Advantageously, these contact pads which are indicated as 44 in FIG. 2 may be made in accordance with the teachings of the above-identified Stoffel patent application Ser. No. 902,287.

The Be.Cu leads 14 are connected as shown to the end 84 of a flex circuit 86. This connection is accomplished using state of the art reflow soldering techniques for making contact to individual contact pads 33, 34 on the end of the hybrid lead frame of FIG. 1A.

Figure 8:
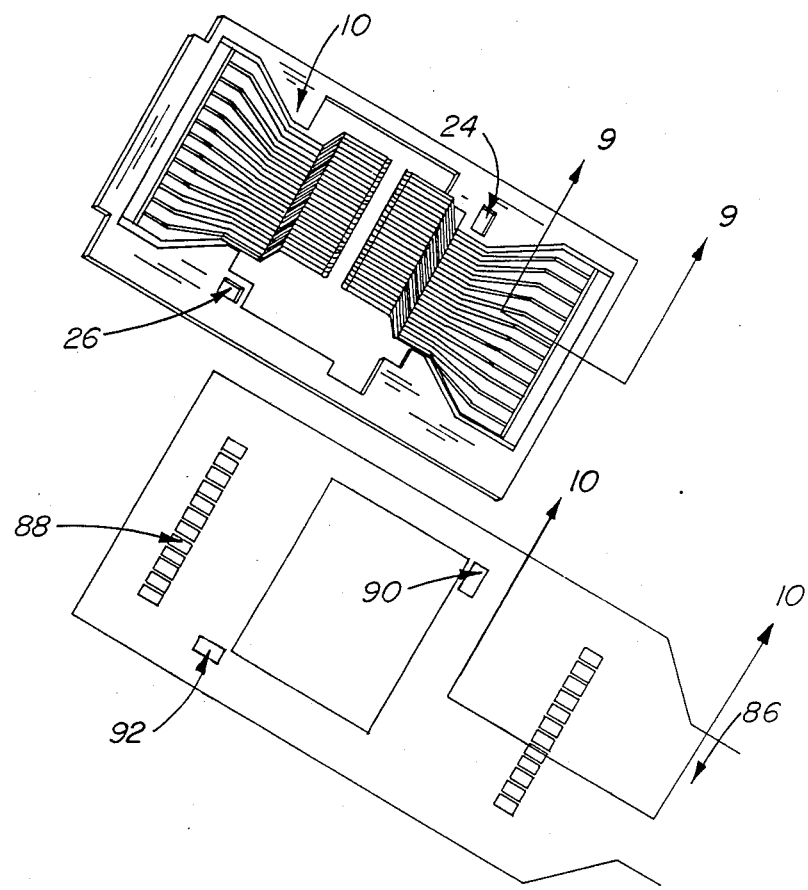
FIG. 8 shows the spatial relationship between the lead frame and the flex circuit to which it connects.

Referring to FIG. 8, the small windows 88 expose individual conductive traces (not shown) of the flex circuit 86 and occur in the same pattern and spacing as the exposed pads 33, 34 of the lead frame of FIG. 1A. When the lead frame 10 is lowered on to the flex circuit 86 in the orientation shown, each exposed lead frame pad 33, 34 (See FIG. 1A) meets the mating pad exposed by windows 88 on the flex circuit. The alignment of the lead frame 10 to the flex circuit 86 is facilitated by matching the alignment openings 24 and 26 in the lead frame 10 with the corresponding openings 90 and 92 on the flex circuit 86.

Figure 9:
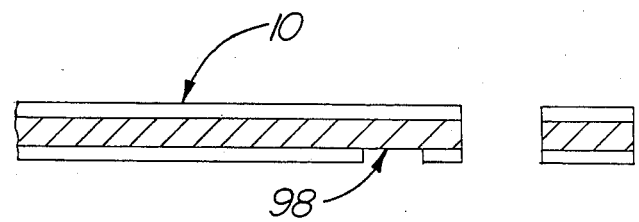
FIG. 9 is a cross section view taken along lines 9—9 of FIG. 8.
Figure 10:
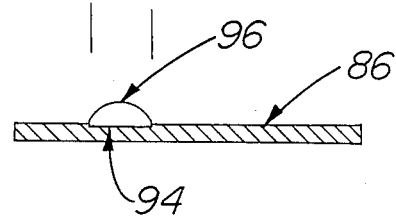
FIG. 10 is a cross section view taken along lines 10—10 of FIG. 8.

FIG. 9 shows a cross section view of the lead frame 10 taken along lines 9—9 of FIG. 8, and FIG. 10 is a cross section view taken along lines 10—10 of FIG. 8. In FIG. 10, an exposed pad 94 is coated with a mound of solder 96 and then aligned with the exposed area 98 in the lead frame 10. When the lead frame 10 is lowered onto the flex circuit 86, the solder mound 96 touches the lead frame pad contact area 98 and these two parts are then clamped together. An infrared lamp is then used to heat the assembly until the solder melts and flows over the pad contact area 98. Once the parts have cooled the clamp is removed.

Various modifications may be made in the above described embodiments without departing from the spirit and scope of this invention. For example, the invention is not specifically limited to the interconnection of flex circuits to thermal ink jet printheads. This invention may instead be used to provide electrical connection between any two members where it is desired to minimize the required contact space requirements in the x,y and Z dimensions as described above and simultaneously provide good compressively forced electrical contact between two adjacent contact members in a single plane of interconnection.

We claim:

1. An electrical interconnecting member suitable for use in establishing a substantially two dimensional removable pressure contact between two interconnect members in a single plane of interconnection, comprising: a lead frame having a plurality of electrically isolated contacts at one area thereon and connected to a corresponding plurality of flexible leads at another area thereon, a continuous insulating coating extending across the width of all of said leads on the top and bottom surfaces thereof and in the spaces between adjacent leads, but exposing the tips of said leads for enabling electrical connection to be made thereto, said insulating coating holding said leads together and still allowing said leads to flex somewhat independently, with said leads extending at a predetermined angle with respect to said plane of interconnection, said angle being defined by an arc which extends between a position at which said tips of said leads are electrically disconnected and a position lying in said plane of interconnection, whereby said flexible leads may be spring biased through said predetermined angle to said plane of interconnection when receiving an electrical device in contact therewith, and said electrical device and said plurality of contacts of said lead frame all will lie substantially in said plane of interconnection.

2. The member defined in claim 1 wherein the leads of said lead frame area beryllium copper alloy and are insulated one from another by a polyimide insulator.

3. An interconnect circuit for providing electrical connection between a thermal ink jet printhead and external electrical circuitry, comprising:
    a. a metal pattern within a lead frame and including a plurality of metal fingers or leads extending in parallel directions toward a central area of the frame and having connection tips defining the area of connection to a corresponding plurality of mating contact pads on a thermal ink jet printhead,
    b. said fingers or leads further extending to a remote area of the lead frame and terminating in a plurality of electrical contact areas to which external electrical circuitry may be connected,
    c. means insulating said fingers or leads one from another and holding said fingers or leads together when flexed, and
    d. said leads extending towards said central area at a predetermined angle with respect to the plane of the electrical contact surface of said printhead; the movement of said printhead into contact with the tips of said leads will flex said leads to a spring biased position and create compressive forces between said tips and the mating contact pads on said printhead, and the distance between said printhead on one side of said interconnect circuit and paper on the other side thereof is minimized.

4. The circuit defined in claim 3 wherein said fingers or leads are a Be. Cu alloy and said insulating means includes a polyimide.

5. An electrical interconnect for providing electrical connection between contacts on an ink jet printhead and external circuitry on a printhead carriage, comprising: a lead frame member having a plurality of individual leads therein which extend from contact areas at the edge of said member to a central area thereof, means insulating said leads from one another and exposing the tips of said leads at said central area to enable connection to said contacts on said printhead, said leads and said insulating means forming a thin flat lead frame member over a large area thereof and is adapted for insertion into a plane of interconnection in said printhead carriage between said printhead and said external circuitry on said carriage, and said tips of said leads extending at a predetermined angle $\theta$ with respect to said plane of interconnection, whereby said lead tips are spring biased to said plane of interconnection when electrical contact is established between said printhead and said external circuitry on said printhead carriage and good force removable pressure contact is established by said interconnect.

6. The interconnect defined in claim 5 wherein said lead are of thin rectangular cross section.

7. The interconnect defined in claim 5 wherein said leads are formed of Be.Cu alloy and said insulating means is a polyimide.

8. A method of connecting an ink jet printhead to external electrical circuitry which includes the steps of:
    a. providing a flexible lead frame with exposed contacts on individual leads thereof, and
    b. connecting an ink jet printhead to one side of said lead frame and connecting said external electrical circuitry to the other side of said lead frame, while
    c. biasing leads of said lead frame to a single common plane, whereby removable spring biased lead contacts may be made to individual contact area on said printhead.

9. A method for making electrical connection between a thermal ink jet printhead and external electrical circuitry in a substantially two dimensional interconnect arrangement which includes the steps of:
    a. providing a flexible lead frame including a plurality of laminated and insulated leads extended at a predetermined angle with respect to a chosen plane of interconnection with said printhead, and
    b. moving a connection surface of said printhead into electrical contact with said leads and coming to rest at said plane of interconnection, whereby the flexure of said leads as they move to the plane of interconnection creates compressive forces between said leads and corresponding mating contact areas on said printhead and enables good firm electrical contacts to be made therebetween in a substantially two dimensional parallel plane interconnection.

10. A method of making an interconnect circuit for an ink jet printhead which comprises the steps of:
   a. providing a metal substrate with good spring properties,
   b. forming a pattern of individual metal leads having tips from said substrate,
   c. forming an adhesive insulating layer of predefined mask geometry surrounding said leads, leaving selected regions of said leads exposed in a central area of said interconnect circuit,
   d. forming an opening in said leads and in said central area of said interconnect circuit while leaving the tips thereof separated one from another in a common plane and spaced apart by a predetermined distance, and
   e. bending the tips of said leads at a predetermined angle with respect to said common plane, whereby the tips of said leads may be spring biased toward said common plane to thereby establish good electrical contact with an ink jet printhead.

11. The method defined in claim 10 wherein said leads are a Be.Cu alloy and said insulating layer includes a polyimide.

12. The method defined in claim 10 which further includes the step of forming a plurality of exposed contact pads at the remote ends of said leads which are adapted for connection to external electrical circuitry, whereby said electrical circuitry and the surface of said ink jet printhead may be electrically interconnected in said common plane.

13. A process for minimizing the distance between the outer surface of an ink jet printhead and a print medium adjacent to a printhead carriage which includes the steps of:
   a. providing a spring biased lead frame having exposed contact ends within or adjacent to a printhead carriage which is operative to move across a print medium,
   b. providing an ink jet printhead having electrical contacts on or closely adjacent to an ink ejection surface thereof,
   c. bringing said electrical contacts of said printhead into forced pressure contact with said contact ends of said leads frame while inserting said printhead into said printhead carriage, whereby said lead frame is biased into a plane of interconnection which is closely adjacent to said print medium, thereby providing very close spacing between said ink ejection surface and said print medium.

* * * * *